United States Patent
See et al.

(10) Patent No.: US 10,276,424 B2
(45) Date of Patent: Apr. 30, 2019

(54) METHOD AND APPARATUS FOR WAFER LEVEL PACKAGING

(71) Applicant: APPLIED MATERIALS, INC., Santa Clara, CA (US)

(72) Inventors: Guan Huei See, Singapore (SG); Yu Gu, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/638,798

(22) Filed: Jun. 30, 2017

(65) Prior Publication Data

US 2019/0006223 A1 Jan. 3, 2019

(51) Int. Cl.
*H01L 21/56* (2006.01)
*H01L 21/683* (2006.01)
*H01L 23/00* (2006.01)
*H01L 23/31* (2006.01)

(52) U.S. Cl.
CPC ........ *H01L 21/6836* (2013.01); *H01L 21/565* (2013.01); *H01L 23/3107* (2013.01); *H01L 24/11* (2013.01); *H01L 24/12* (2013.01); *H01L 2224/0401* (2013.01)

(58) Field of Classification Search
CPC ... H01L 23/3107; H01L 24/11; H01L 21/565; H01L 24/12; H01L 2224/0401; H01L 21/6836
USPC .......................................................... 257/620
See application file for complete search history.

(56) References Cited

U.S. PATENT DOCUMENTS

| 2009/0242197 A1 | 10/2009 | Sunohara et al. |
| 2011/0129994 A1 | 6/2011 | Park et al. |
| 2015/0357278 A1* | 12/2015 | Lin .................. H01L 23/49827 257/738 |

(Continued)

FOREIGN PATENT DOCUMENTS

| KR | 10-2014-0038079 A | 3/2014 |
| WO | WO 03/050865 A1 | 6/2003 |

OTHER PUBLICATIONS

International Search Report and Written Opinion dated Oct. 26, 2018 for PCT Application No. PCT/US2018/039315.

*Primary Examiner* — Fernando L Toledo
*Assistant Examiner* — Adam S Bowen
(74) *Attorney, Agent, or Firm* — Moser Taboada; Alan Taboada (57) ABSTRACT

Methods and apparatus for wafer level packaging are described herein. According to one embodiment, a method comprises depositing an adhesive layer atop a carrier, placing at least a portion of a substrate pre-fabricated with a plurality of die cavities and a plurality of through vias atop the laminate, inserting a die into each of the die cavities, encapsulating the die and the substrate and debonding and removing the laminate and the carrier from the encapsulated die and substrate. Another embodiment provides an apparatus comprising a substrate, a plurality of die cavities formed through the substrate and a plurality of conductive through vias disposed through the substrate and arranged about the perimeter of each die cavity, wherein a top surface of the substrate is exposed for application of an encapsulating layer and a bottom surface of the substrate is exposed for placement on an adhesive layer.

20 Claims, 11 Drawing Sheets

(56) References Cited

U.S. PATENT DOCUMENTS

2017/0084548 A1    3/2017  Hu
2017/0271241 A1*  9/2017  Marimuthu ............ H01L 24/19

\* cited by examiner

METHOD AND APPARATUS FOR WAFER LEVEL PACKAGING

FIELD

Embodiments of the present invention generally relate to methods and apparatus for processing substrates. Specifically, embodiments of the present disclosure relate to methods and apparatus for substrate package on package (PoP) processing.

BACKGROUND

Package-on-package (PoP) stacking of substrates and devices offers significant advantages primarily related to reducing device footprint. PoP is used to improve electrical performance due to shortened interconnections between associated packages. PoP can also be used to improve testability by, for example, permitting separate testing of logic and memory devices.

In advanced substrate level packaging, PoP is used to save area by stacking different dies and different functionality packages atop each other. However, PoP technology still has problems posed by the inherent conflict between the need to minimize thickness and the need to minimize and withstand warpage. Warpage creates some of the most debilitating problems encountered in PoP assemblies, such as open or short circuits caused by the separation of materials, or by the ingress of moisture between separated materials. Thin PoP assemblies having layers of different thermal properties are particularly affected by warping. Several common PoP processing are used to address these problems. However, the inventors have observed that the commonly available PoP processes are ineffective, costly, and time consuming.

Accordingly, the inventors have developed improved techniques for forming PoP assembly packages having larger effective die surface area, robust package-to-package connectivity, and reduced warpage.

SUMMARY

Methods and apparatuses for wafer level packaging are provided herein. In some embodiments, a provided apparatus comprises a substrate, a plurality of die cavities formed through the substrate and a plurality of conductive through vias disposed through the substrate and arranged about the perimeter of each die cavity, wherein a top surface of the substrate is exposed for application of an encapsulating layer and a bottom surface of the substrate is exposed for placement on an adhesive layer.

Another embodiment provides an electronics package comprising a substrate consisting of an array of die cavities formed through the substrate, wherein each die cavity is surrounded by one or more rows of through vias having conductive materials disposed therein, a plurality of dies disposed in a cavity in the array of die cavities, the encapsulating material disposed on the top surface of the substrate for securing the plurality of dies in place in each cavity in the substrate and a top redistribution layer abutting the encapsulating material, coupling the plurality of dies with the one or more rows of through vias, configured to couple with a top electronics packages stacked above the electronics package and a bottom redistribution layer abutting the encapsulating material, coupling the plurality of dies with the one or more rows of through vias, configured to couple with a bottom electronics packages stacked below the electronics package.

In yet another embodiment, a method for wafer level packaging comprises depositing an adhesive layer atop a carrier, placing at least a portion of a substrate pre-fabricated with a plurality of die cavities and a plurality of conductive through vias atop the laminate, inserting a die into each of the die cavities, encapsulating the die and the substrate and de-bonding and removing the laminate and the carrier from the encapsulated die and substrate.

Other and further embodiments of the present invention are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatuses for wafer level packaging are provided herein. The inventive methods described herein may be utilized in package-on-package (PoP) fabrication. According to some embodiments, a panel or wafer with pre-formed interconnect vias and die cavities is placed on a supporting member. Dies are then placed in each cavity and the package is secured via a securing means. The supporting member and any extraneous matter is removed using standard processes. In some embodiments, a panel is fabricated and cut so that portions of the panel are placed individually on the supporting member. In some embodiment, a glass wafer is fabricated containing the cavities and vias, and the entire wafer is placed on the supporting member. In all embodiments, dies are subsequently placed and secured using molding, and the de-bonding and other standard processes are performed.

Figure 1:
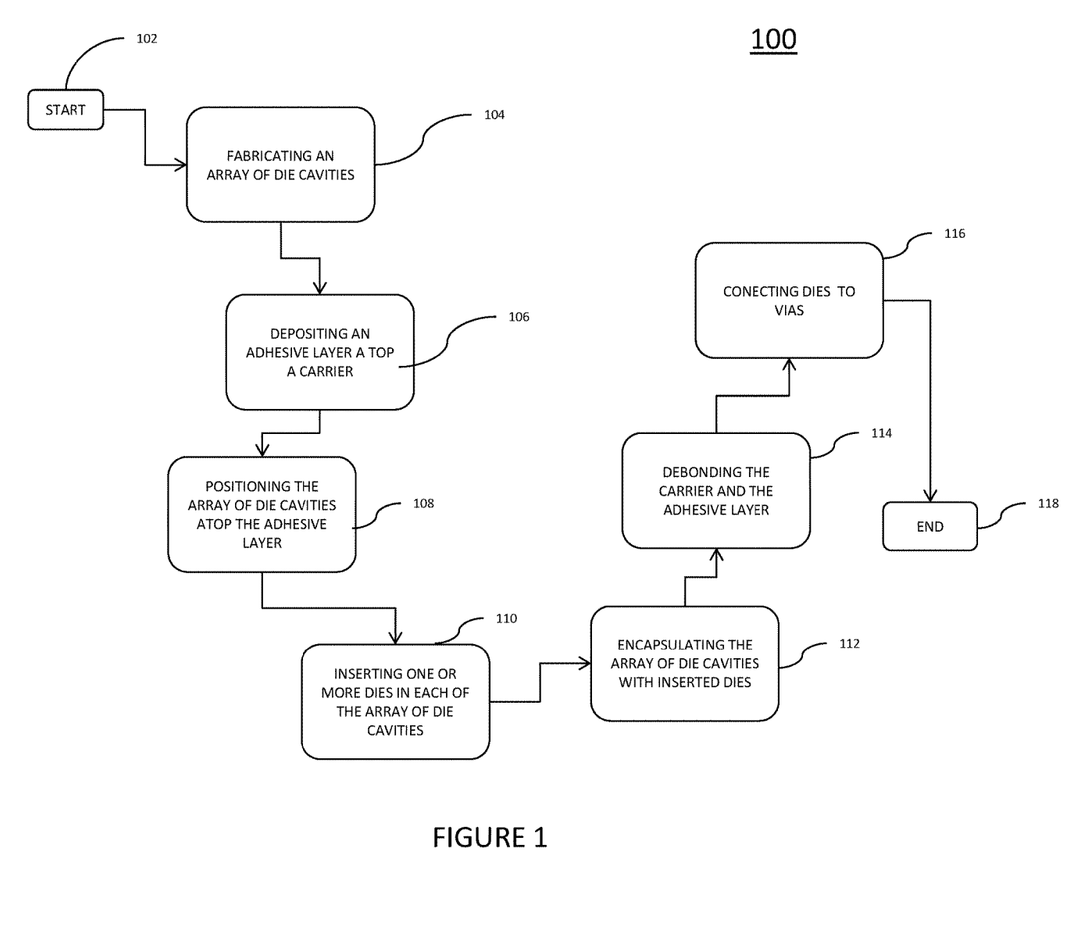
FIG. 1 is a flow diagram for a method for waver level packaging in accordance with embodiments described herein.

FIG. 1 depicts a flow chart of a method 100 for fan out wafer level packaging in accordance with some embodiments of the present disclosure.

The method 100 begins at 102 and proceeds to 104 where an array of die cavities is fabricated into a panel or wafer. In some embodiments, the array of die cavities and vias are formed by laser ablation and the vias are filled by a process such as plating with a conductive material such as copper or solder. In embodiments where the panel is a PCB or glass material panel, the panel is sliced into at least a single column of contiguously connected die enclosures comprising a die cavity with a plurality of through vias (arranged in one or more rows chosen according to usage) about the perimeter of the cavity. In embodiments where the plane is a glass wafer, the glass wafer is not sliced.

At 106, an adhesive layer is deposited atop a carrier layer. In some embodiments, the adhesive layer is a thermal release adhesive, with an approximate thickness of 100 µm. The method proceeds to 108, where the array of die cavities is positioned atop the adhesive layer. In embodiments using a glass wafer, the entire glass wafer is positioned atop the adhesive layer, while the PCB panel is sliced prior to individual placement to maintain structural integrity of the array of die cavities.

At 110, one or more dies are placed inside each of the array of die cavities. The die active surface may face up or down relative to the thermal release tape. At 112, the array of die cavities with inserted dies is encapsulated entirely in a mold using, for example, a thermal compress molding. The die cavities are fabricated such that the dies are smaller and thinner than the cavities. Due to the larger effective die surface area including the cast and the die, shifting of the die during subsequent workpiece processing is reduced because the mold shrinks and secures the die, withstanding shear forces. The encapsulated workpiece is also more flexible for system-in-package (SiP) or multi-die configuration.

Next, at 114, the carrier and adhesive layer are de-bonded from the die-cast or wafer and removed by heating the wafer to a desired temperature where the adhesive will stop adhering to the wafer, providing an encapsulated electronics package that can be stacked to form a PoP structure. At 116, the dies are connected to the vias as described with respect to FIGS. 5C and 9C below. The method ends at 118.

The method 100 produces an electronics package that enables Z-height connectivity (e.g., connecting a top package and a bottom package to form a "package on package" structure using the through vias) while shortening the overall package process cycle time. A top copper (Cu) redistribution layer (RDL) functions as a connected input/output pad from the die to the through vias and to form the connection from a top device to a bottom device in the package. Further, the electronics package improves warpage performance due to the use of the die/wafer cast. A bottom copper (Cu) redistribution layer (RDL) functions as a connected input/output pad from the die to the through vias and to form the connection from a bottom device to a top device in the package.

Figure 2:
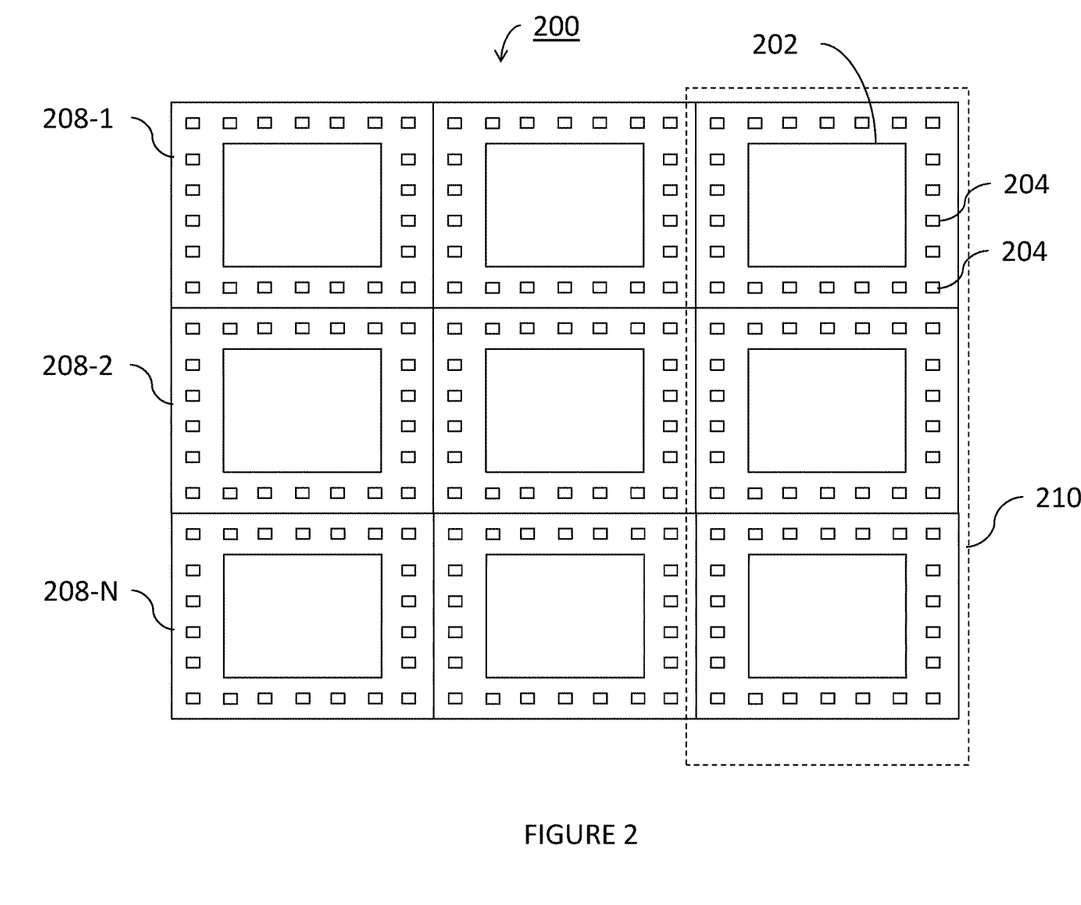
FIG. 2 depicts a die cast in accordance with at least some embodiments described herein.

FIG. 2 depicts embodiments of the method 100 of wafer packaging for a die cast 200. In some embodiments, the die cast 200 is a fabricated substrate panel using printed circuit board (PCB) material or glass material. A die enclosure 208 comprises a cavity 202 with a plurality of through vias 204 arranged about the perimeter of the cavity 202. The die cast 200 contains an M×N array of such die enclosures, e.g., 208-1 to 208-N. In some embodiments, the die cavity is a square or rectangle less than 1 mm$^2$ in area, the area of the cavity 202 generally being larger than the area of a die to be placed in the cavity 202. The plurality of vias 204 may be square or circular, with a circular diameter approximately in the range of 50-200 µm. Conductive material (e.g., copper, solder, or the like) is disposed in the plurality of through vias to provide an interconnect to packages disposed on top or bottom of the die cast 200. In some embodiments, the plurality of vias 204 is arranged in one or more rows about the perimeter of the cavity 102.

In some embodiments, the die cast 200 is diced into individual strips of die enclosures. In other embodiments, the die cast 200 is cut into individual die enclosures. In yet other embodiments, the die cast 200 is cut into smaller arrays of die enclosures.

Figure 3A:
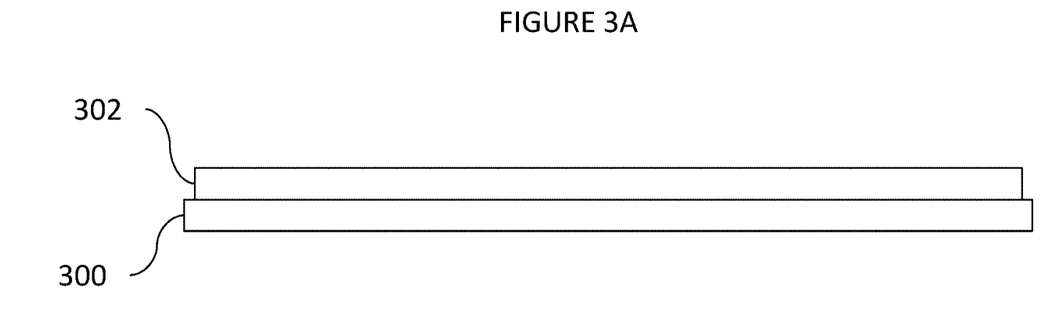
FIGS. 3A-3B, 4, and 5A-5C respectively illustrate stages of fabrication in a wafer level packaging process in accordance with embodiments described herein.

FIG. 3A is an illustration of wafer level packaging in accordance with some embodiments described herein. A carrier 300 supports a laminate 302. The laminate 302 is, in some embodiments, a molding tape laminate adhesive material or thermal release lamination. The carrier 300 comprises any material suitable for supporting die cast wafer level packaging. According to some embodiments, the carrier 300 is a suitable metal.

Figure 3B:
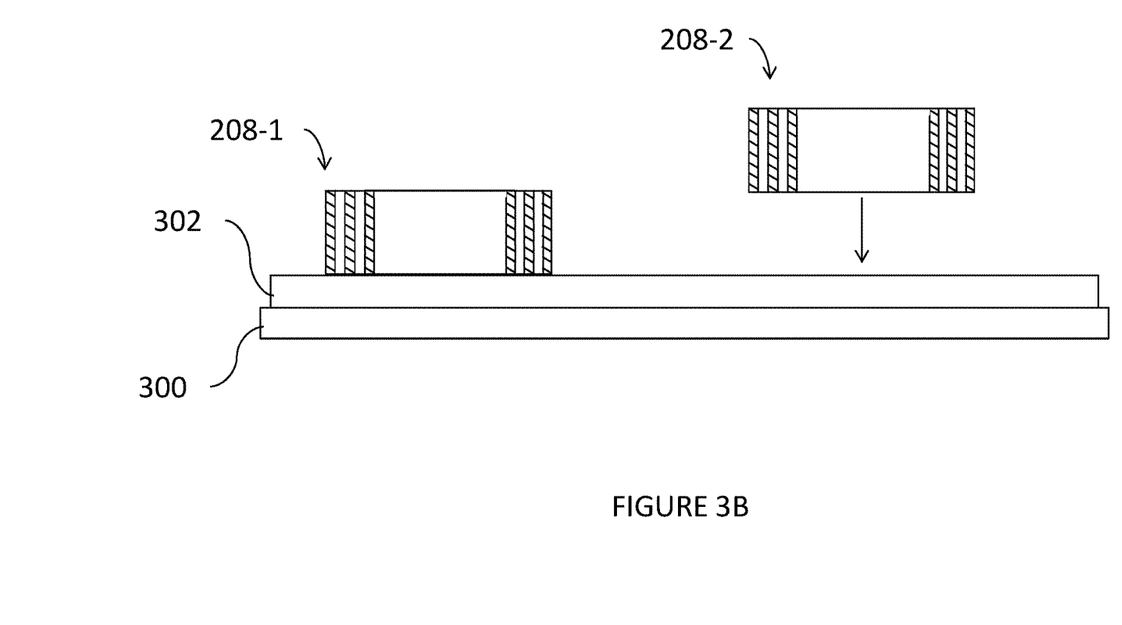

In FIG. 3B, the portions, strips, or individual die enclosures, e.g., 208-1 and 208-2 are placed on the laminate 302 to secure the die enclosures in place atop the carrier 300. For example, in some embodiments, a mechanical controller, or robot, picks and places each of the strips or individual die enclosures on to the laminate 302. The laminate 302 adheres to the carrier 300 and 208-1 and 208-2. The carrier 300 provides support to 308-1 and 208-2 during wafer level packaging.

Figure 4:
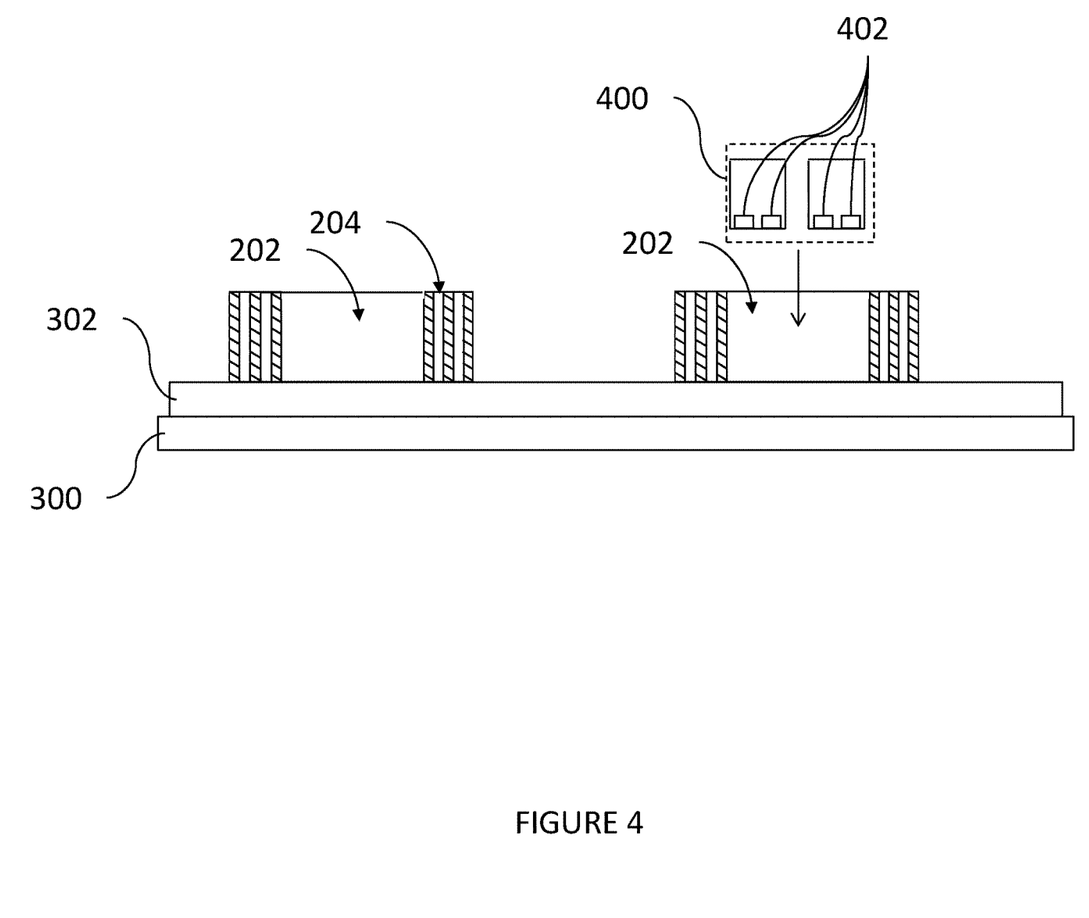

In FIG. 4, one or more dies 400 are placed in each cavity 202. Each of the one or more dies 400 has an area that is smaller than the area of the cavity 202 so that the dies can be easily placed in the cavity 202 during the process. In some embodiments, each of the dies is a silicon (Si) die. Each of the one or more dies comprises one or more I/O pads 402 which are contacts for coupling the die to the plurality of vias 204.

Figure 5A:
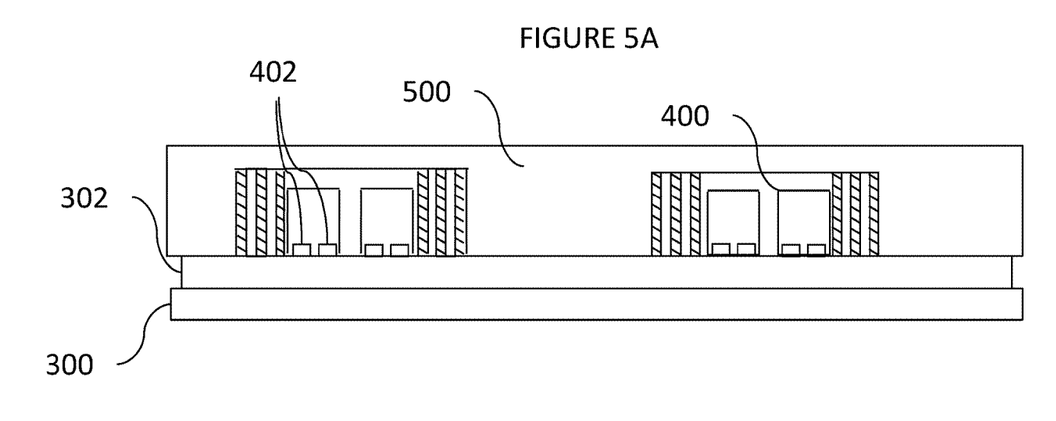

In FIG. 5A, a standard compressive molding process is applied to the package for wafer reconstitution which forms an encapsulating material, or molding 500 such as an epoxy encapsulating the die enclosure 208 and the one or more dies 400 placed within the cavity 202. In some embodiments thermal compress molding is used to encapsulate the wafer with epoxy molding compound. The process temperature for encapsulating the dies is lower than the melting point temperature of the laminate 302.

Figure 5B:
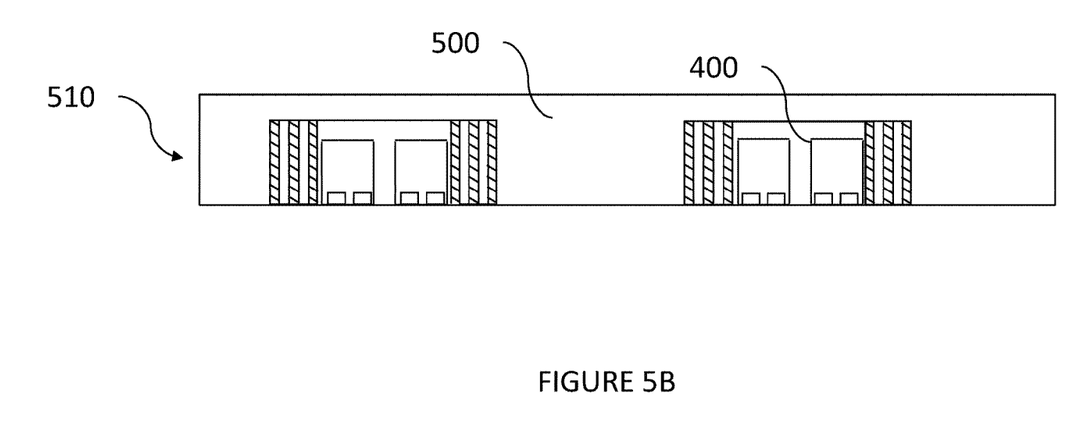

Subsequently, in FIG. 5B, the carrier 300 and the laminate 302 are removed via a wafer de-bond and other standard processes leaving the finished wafer package 510. In some embodiments, de-bonding is performed using a thermal process. When the wafer package 510 with the carrier 300 and laminate 302 are heated to a particular temperature, the laminate 302 loses adhesion with the wafer package 510.

Figure 5C:
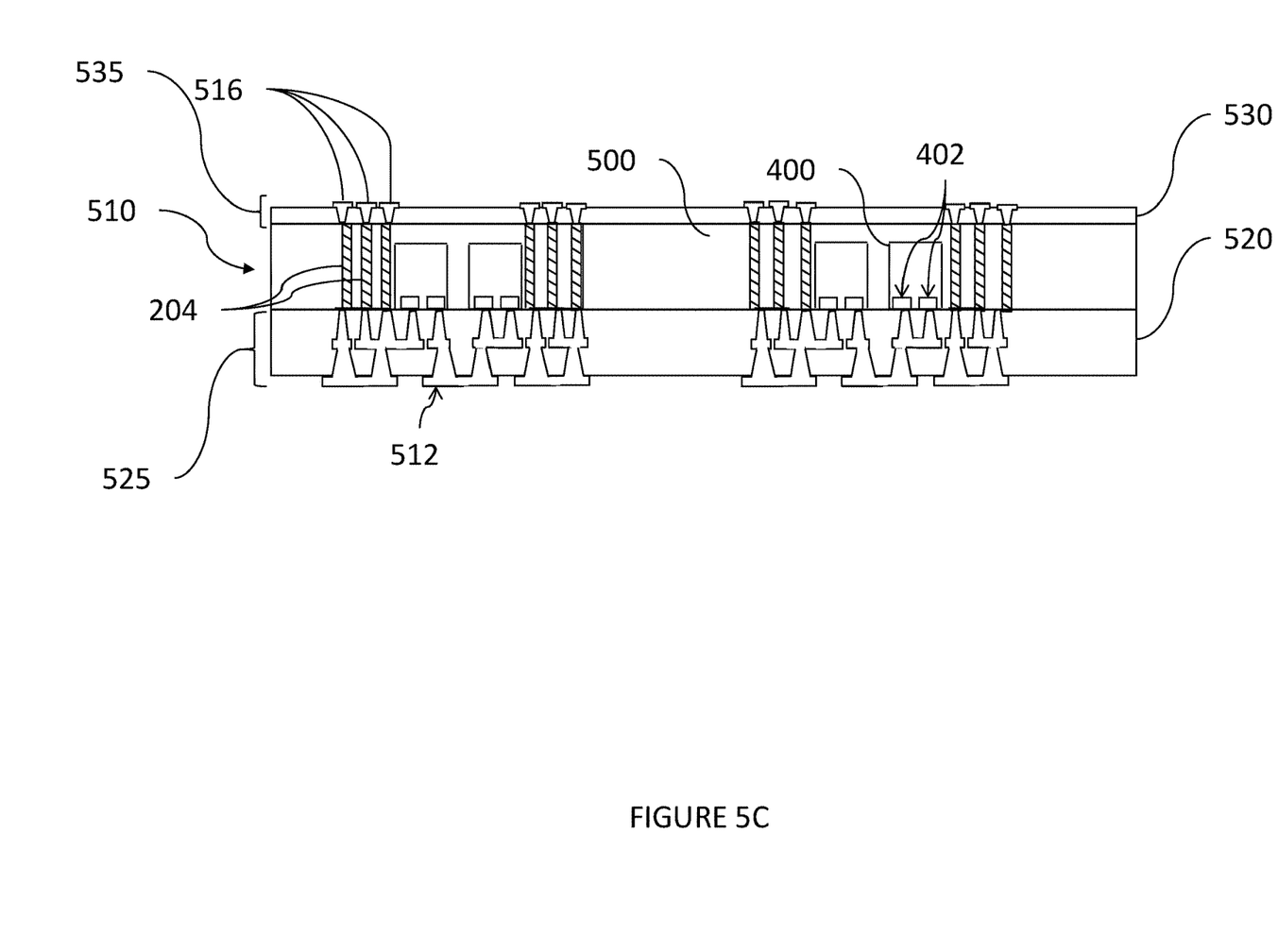

In FIG. 5C, a polymer passivation layer 520 is deposited on the entire wafer package 510. In some embodiments, the passivation layer 520 is formed via spin coating and may range from 5-10 µm thick. Polymer lithography is performed to etch openings atop each I/O pad 402 and then similar lithography is performed to etch openings atop each of the through vias 204.

Physical vapor deposition (PVD) is then used to deposit a conductive seed layer, for example of copper, and photoresist lithography is performed to define each connection with each I/O pad 402 and via 204. A plating process is performed to plate a conductive material, such as copper, to fill the recesses, forming contacts 512. The contacts 512 and the polymer layer 520 form a top redistribution layer 525 abutting the molding 500. Any photoresist is stripped away so that each conductive (e.g., copper) trace from the vias connects with the desired I/O pad and the seed layer is etched using any suitable method. While a particular configuration of connections is shown between I/O pads 402 and vias 204, the configuration is dependent on a circuit and die-type and may differ from what is shown without departing from the invention. Polymer layer 530 and contacts 516 are created in a similar fashion as layer 520 and contacts 512 after the mold 500 is ground from the backside of the package 510 to form a bottom redistribution layer 535 abutting the molding 500.

As a result of the process described in FIGS. 2-5C, the cost of creating connections in the wafer package 510 is significantly reduced because costly ~200 um thick copper (Cu) pillars are avoided. Further, the process time in forming the wafer package 510 is significantly reduced by avoiding known slow processes such as through-mold via performed using laser drilling. Avoiding laser drilling also allows the vias in the wafer package 510 to have significantly smoother sidewalls making physical vapor deposition (PVD) seed deposition simpler to integrate.

Figure 6:
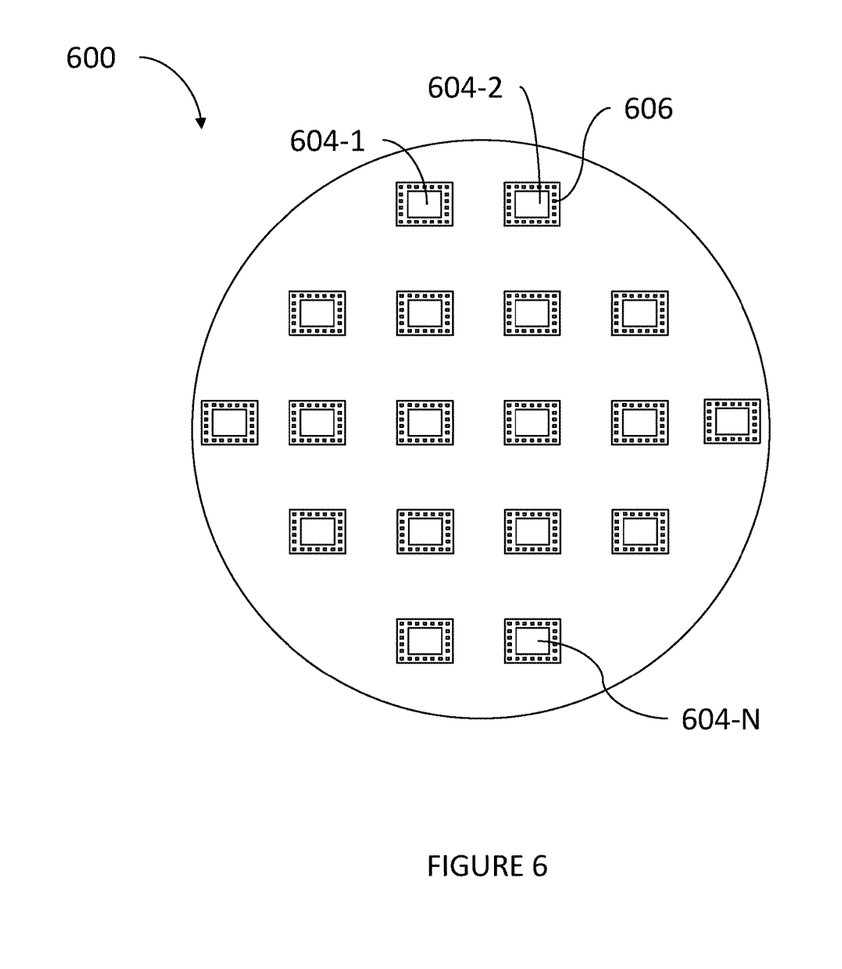
FIG. 6 illustrates a fabricated glass wafer used in accordance with embodiments described herein.

FIG. 6 depicts a fabricated glass wafer 600 in a top-down view used in accordance with other embodiments described herein. The glass wafer 600 is a pre-fabricated substrate with a plurality of cavities 604-1, 604-2 to 604-N. A plurality of pre-fabricated through vias 606 is arranged about the perimeter of each cavity. Conductive material (e.g., copper or the like) is disposed in the plurality of through vias to provide an interconnect to packages disposed on top or bottom of the die cast 200. In some embodiments, the plurality of vias 606 is arranged in one or more rows about the perimeter of each cavity.

Figure 7A:
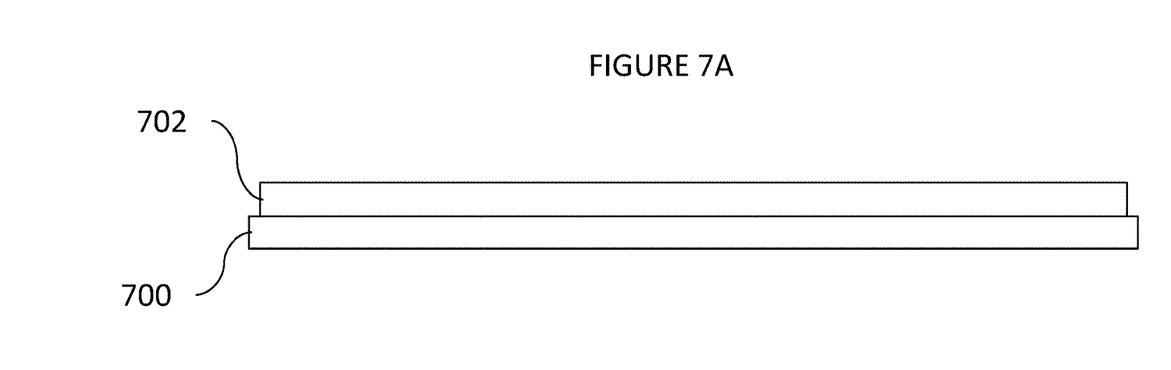
FIGS. 7A-7B, 8, and 9A-9C respectively illustrate stages of fabrication in a wafer level packaging process in accordance with embodiments described herein.

FIG. 7A depicts wafer level packaging in accordance with embodiments described herein. FIG. 7A illustrates a carrier 700 with a laminate 702 formed atop the carrier 700 in a side view. In some embodiments, the laminate 702 is a molding tape laminate adhesive material (e.g., an adhesive layer). The carrier 700 is any material suitable for supporting a glass wafer such as wafer 600.

Figure 7B:
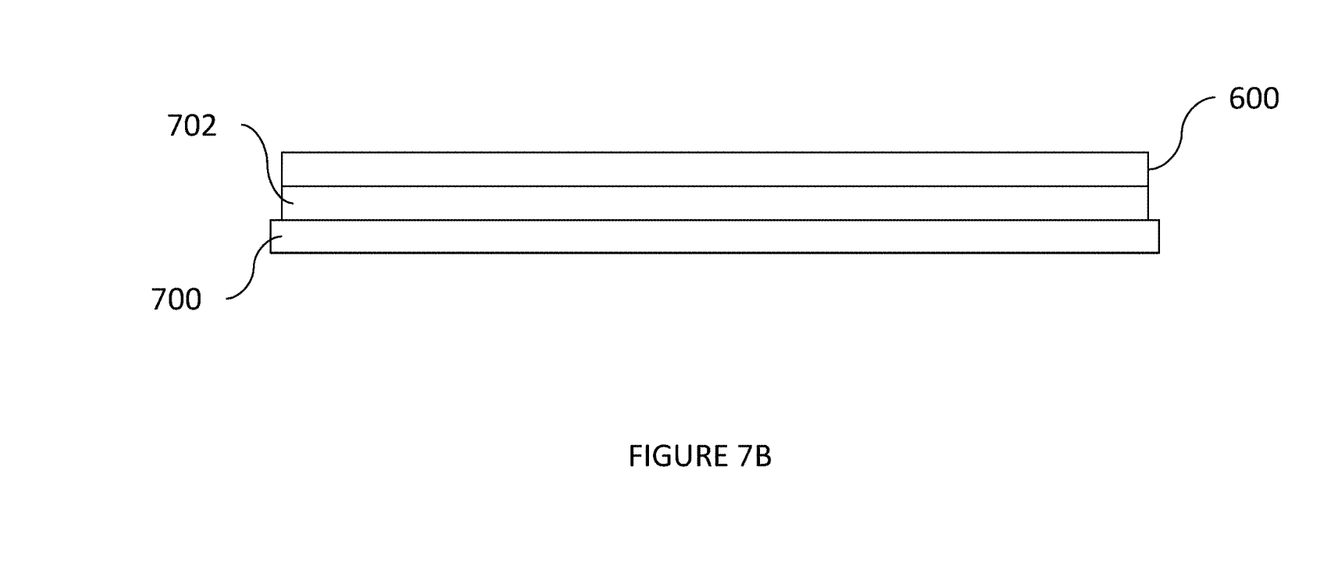

Subsequently in FIG. 7B, the glass wafer 600 is placed atop the laminate 702, the laminate 702 securing the wafer 600 on the carrier 700. The laminate 702 adheres to the carrier 700 and the glass wafer 600. The carrier 700 provides support to the glass wafer 600 during the wafer level packaging process.

Figure 8:
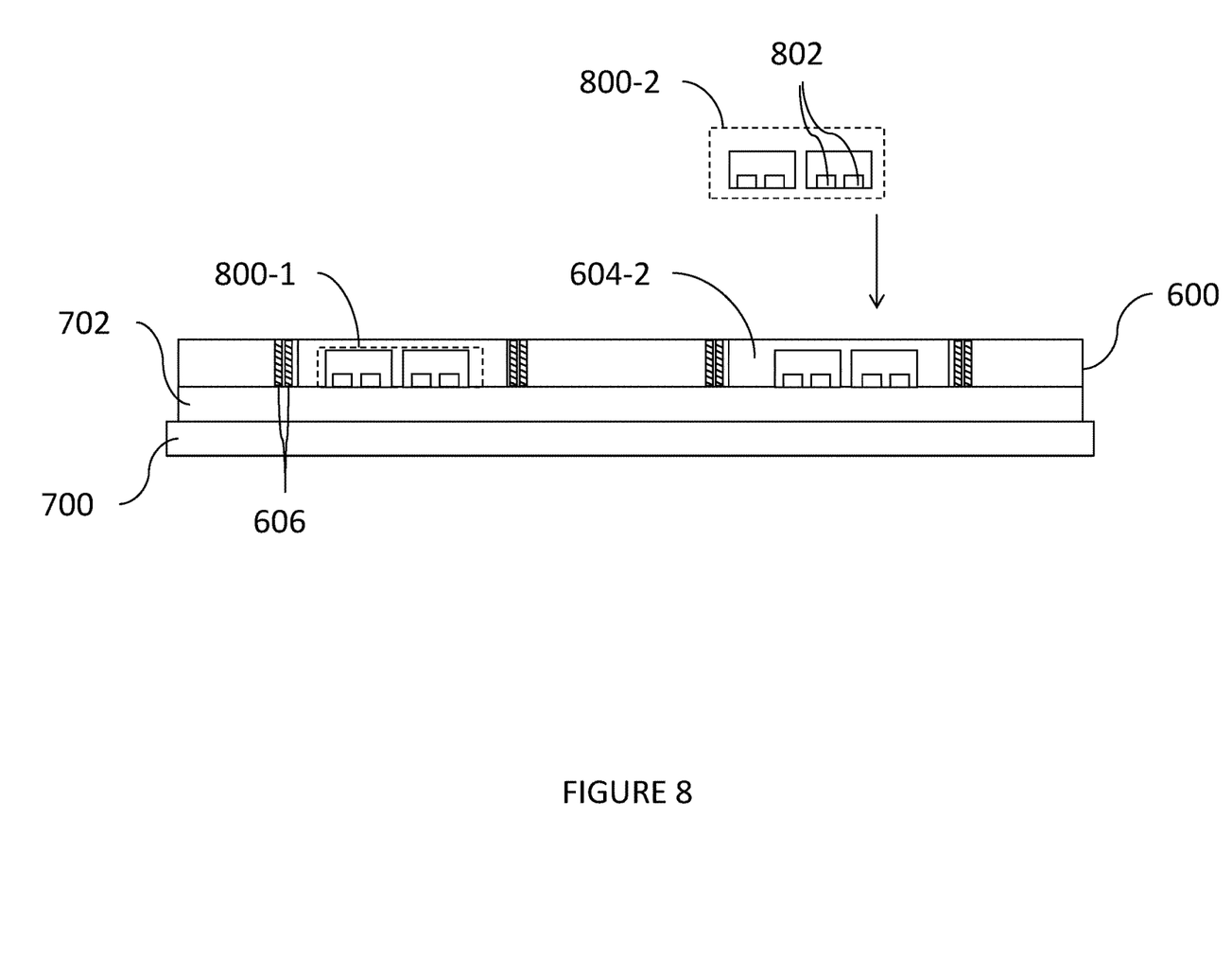

In FIG. 8, one or more dies 800-1, and one or more dies 800-2 are placed in respective cavities 604-1 (not shown/obstructed by dies 800-1) and 604-2, shown in a schematic side view.

Figure 9A:
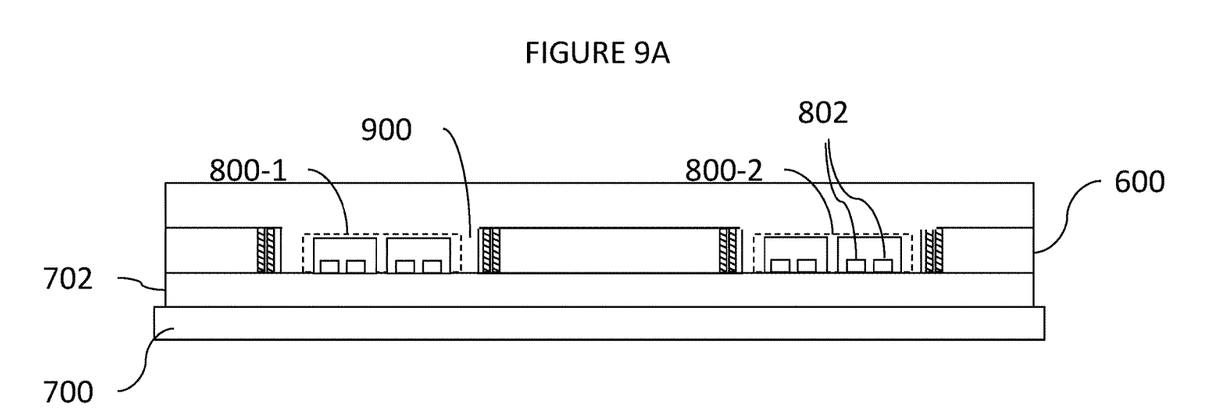

In FIG. 9A, a molding process is performed forming an encapsulating material, or mold 900 such as an epoxy over the glass wafer 600, encapsulating the placed dies 800-1 and 800-2. In some embodiments the molding process includes using a thermal compress molding to encapsulate the exposed portion of the glass wafer 600 with an epoxy molding compound. The process temperature for encapsulating the dies in mold 900 is lower than the melting point temperature of the laminate 702 so as to prevent melting of the laminate 702.

Figure 9B:
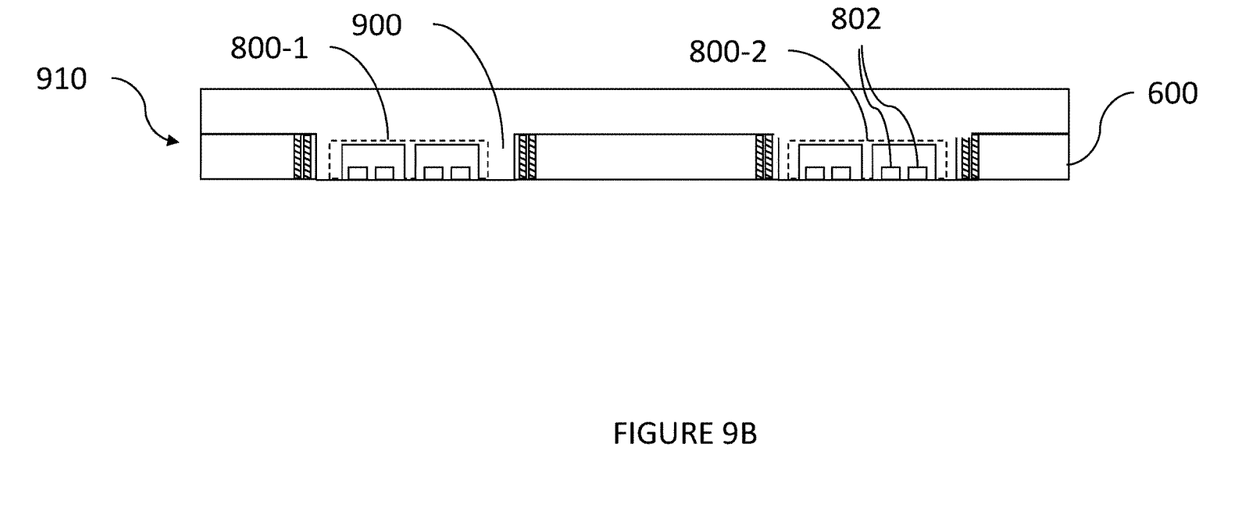

In FIG. 9B, in a de-bonding process the carrier 700 and the laminate 702 are removed, leaving completed package 910, ready to include in a PoP structure. A portion of the mold 900 is removed via standard processes, leaving the mold 900 encapsulating the dies 800-1 and 800-2 within the cavities 604-1 and 604-2.

Figure 9C:
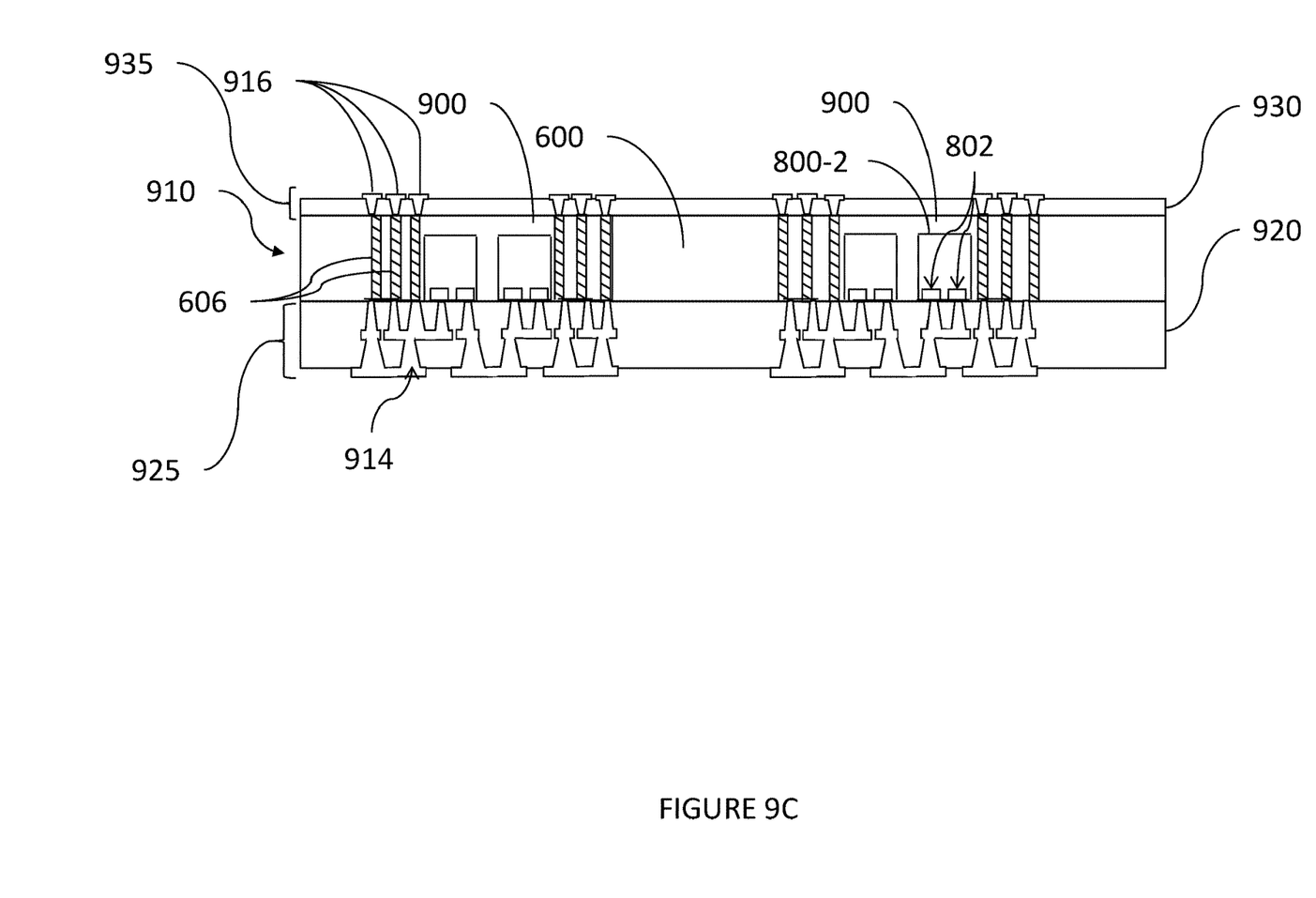

In FIG. 9C, a polymer passivation layer 920 is deposited on the entire wafer package 910. In some embodiments, the passivation layer 920 is formed via spin coating and may range from 5-10 μm thick. Polymer lithography is performed to etch openings atop each I/O pad 902 and then similar lithography is performed to etch openings atop each of the through vias 606.

Physical vapor deposition (PVD) is then used to deposit a seed layer of a conductive material, such as copper, and photo-resist lithography is performed to define each connection with each I/O pad 802 and via 606. A plating process is performed to plate a conductive material, such as copper, to fill the recesses, forming contacts 914. The contacts 914 and the polymer layer 920 form a top redistribution layer 925 abutting the molding 900 and the glass wafer 600. Any photoresist is stripped away so that each conductive (e.g., copper) trace from the vias connects with the desired I/O pad and the seed layer is etched using any suitable technique. While a particular configuration of connections is shown between I/O pads 802 and vias 606, the configuration is dependent on the circuit and die type and may differ from what is shown without departing from the invention. Polymer layer 930 and contacts 916 are created in a similar fashion as layer 920 and contacts 914 after mold 900 is ground from the backside of the package 910 to form a bottom redistribution layer 935 abutting the molding 900 and the glass wafer 600.

While the foregoing is directed to embodiments of the present disclosure, other and further embodiments of the disclosure may be devised without departing from the basic scope thereof.

The invention claimed is:

1. A apparatus for use in wafer package processing, comprising:
   a substrate;
   a plurality of die cavities formed through the substrate; and
   a plurality of conductive through vias disposed through the substrate and arranged about the perimeter of each die cavity,
   wherein a top surface of the substrate is exposed for application of an encapsulating layer and a bottom surface of the substrate is exposed for placement on an adhesive layer.

2. The substrate of claim 1, wherein the substrate is a printed circuit board.

3. The substrate of claim 1, wherein the substrate is a glass wafer.

4. The substrate of claim 1, wherein the plurality of conductive through vias are filled with one of copper or solder.

5. An electronics package comprising:
   a substrate consisting of an array of die cavities formed in the substrate, wherein each die cavity is surrounded by one or more rows of through vias having conductive materials disposed therein;
   a plurality of dies disposed in a cavity in the array of die cavities;
   an encapsulating material disposed on the top surface of the substrate for securing the plurality of dies in place in each cavity in the substrate; and
   a top redistribution layer abutting the encapsulating material, coupling the plurality of dies with the one or more rows of through vias, configured to couple with a top electronics packages stacked above the electronics package; and
   a bottom redistribution layer abutting the encapsulating material, coupling the plurality of dies with the one or more rows of through vias, configured to couple with a bottom electronics packages stacked below the electronics package.

6. The electronics package of claim 5, wherein each via in the one or more rows of through vias are filled with Copper or solder.

7. The electronics package of claim 5, wherein the encapsulating material comprises an epoxy molding compound.

8. The electronics package of claim 5, wherein the array of die cavities is formed by an arrangement of one or more continuous strips of die cavities.

9. The electronics package of claim 5, wherein the array of die cavities is formed by an arrangement of individual die cavities.

10. The electronics package of claim 5, wherein the substrate is a printed circuit board.

11. The electronics package of claim 5, wherein the array of die cavities is formed in a glass substrate, and wherein the encapsulating material encapsulates the glass substrate and secures the plurality of dies in the glass substrate.

12. A method for wafer level packaging, comprising:
depositing an adhesive layer atop a carrier;
placing at least a portion of a substrate pre-fabricated with a plurality of die cavities disposed through the substrate and a plurality of conductive through vias disposed through the substrate atop the adhesive layer;
inserting a die into each of the die cavities forming an electronics package;
encapsulating the die and the substrate in an encapsulating material; and
debonding and removing the adhesive layer and the carrier from the encapsulated die and substrate.

13. The method of claim 12, wherein the adhesive layer is a molding tape.

14. The method of claim 12, wherein encapsulating the die and the substrate comprises a thermal compression molding process.

15. The method of claim 12, wherein the process temperature for encapsulating the electronics package is higher than the melting point temperature of the adhesive layer.

16. The method of claim 12, wherein the substrate is a printed circuit board (PCB).

17. The method of claim 16, further comprising:
slicing the PCB into smaller dimensions prior to placing the substrate atop the adhesive layer.

18. The method of claim 17, wherein the smaller dimensions comprise a single column of one or more contiguous die enclosures, the die enclosures comprising a cavity with a plurality of through vias arranged along the perimeter of the cavity in one or more rows.

19. The method of claim 12, wherein the substrate is a wafer and the entire wafer is placed on the adhesive layer.

20. The method of claim 19, wherein the wafer is a glass wafer.

* * * * *